United States Patent
Wicker et al.

(10) Patent No.: US 6,394,026 B1
(45) Date of Patent: *May 28, 2002

(54) LOW CONTAMINATION HIGH DENSITY PLASMA ETCH CHAMBERS AND METHODS FOR MAKING THE SAME

(75) Inventors: Thomas E. Wicker, Reno, NE (US); Robert A. Maraschin, Cupertino; William S. Kennedy, Redwood Shores, both of CA (US)

(73) Assignee: LAM Research Corporation, Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/487,325

(22) Filed: Jan. 19, 2000

Related U.S. Application Data

(63) Continuation of application No. 09/161,074, filed on Sep. 25, 1998, now Pat. No. 6,129,808, which is a continuation-in-part of application No. 09/050,902, filed on Mar. 31, 1998, now abandoned.

(51) Int. Cl.[7] ............................................. C23C 16/507
(52) U.S. Cl. ............................ 118/723 AN; 118/723 E; 118/723 I; 156/345.43; 156/916; 376/150; 376/136; 428/594; 216/67
(58) Field of Search ............................. 118/723 E, 728, 118/723 I; 156/345; 219/121.59, 405; 438/712, 729; 361/234; 427/577; 428/594; 376/650, 136; 216/67

(56) References Cited

U.S. PATENT DOCUMENTS

| | | | |
|---|---|---|---|
| 4,399,546 A | | 8/1983 | Phillips ........................ 373/115 |
| 4,690,793 A | * | 9/1987 | Hitachi et al. ............... 376/136 |
| 4,981,551 A | | 1/1991 | Palmour ...................... 438/712 |
| 4,981,761 A | * | 1/1991 | Ookouchi et al. ........... 428/594 |
| 5,182,075 A | * | 1/1993 | Gotoh et al. ................. 376/150 |
| 5,366,585 A | * | 11/1994 | Robetson et al. .............. 216/67 |
| 5,367,139 A | | 11/1994 | Bennett et al. ......... 219/121.59 |
| 5,444,217 A | | 8/1995 | Moore et al. ................. 219/405 |
| 5,460,684 A | | 10/1995 | Saeki et al. .................. 156/345 |
| 5,494,523 A | | 2/1996 | Steger et al. ............. 118/723 E |
| 5,538,230 A | | 7/1996 | Sibley ......................... 269/296 |

(List continued on next page.)

FOREIGN PATENT DOCUMENTS

| | | |
|---|---|---|
| EP | 63273 | 10/1982 |
| JP | 246238 | 9/1997 |
| WO | WO98/14980 | 4/1998 |
| WO | 98/14980 | 4/1998 |
| WO | 99/50886 | 10/1999 |
| WO | WO99/50886 | 10/1999 |

OTHER PUBLICATIONS

J.Linke et al, "Behavior of boron–doped graphites, plasma–sprayed B4C, and a–C/B:H as plama–facing materials" Fushion Tech. 20, Sep. 1991 pp. 228–231.*

Hampshire et al. "Engineering Properties of Nitrides", Engineered Materials Handbook—Ceramics and Glasses vol. 4, ASM International, 1991, pp. 812–820.*

Primary Examiner—Gregory Mills
Assistant Examiner—Rudy Zervigon
(74) Attorney, Agent, or Firm—Burns, Doane, Swecker & Mathis, LLP

(57) ABSTRACT

A plasma processing chamber having a chamber liner and a liner support, the liner support including a flexible wall configured to surround an external surface of the chamber liner, the flexible wall being spaced apart from the wall of the chamber liner. The apparatus can include a heater thermally connected to the liner support so as to thermally conduct heat from the liner support to the chamber liner. The liner support can be made from flexible aluminum material and the chamber liner comprises a ceramic material. The flexible wall can include slots which divide the liner support into a plurality of fingers which enable the flexible wall to absorb thermal stresses.

30 Claims, 9 Drawing Sheets

U.S. PATENT DOCUMENTS

| | | | |
|---|---|---|---|
| 5,569,356 A | 10/1996 | Lenz et al. | 438/729 |
| 5,584,936 A | 12/1996 | Pickering et al. | 118/728 |
| 5,641,375 A * | 6/1997 | Nitescu et al. | 156/345 |
| 5,725,675 A | 3/1998 | Fong et al. | 118/723 E |
| 5,788,799 A * | 8/1998 | Steger et al. | 156/345 |
| 5,904,800 A * | 5/1999 | Mautz | 156/345 |
| 5,993,594 A * | 11/1999 | Wicker et al. | 156/345 |
| 6,095,084 A * | 8/2000 | Shamouilian et al. | 118/723 E |
| 6,129,808 A * | 10/2000 | Wicker et al. | 156/345 |
| 6,189,484 B1 * | 2/2001 | Yin et al. | 118/723 I |

* cited by examiner

LOW CONTAMINATION HIGH DENSITY PLASMA ETCH CHAMBERS AND METHODS FOR MAKING THE SAME

This application is a continuation of application Ser. No. 09/161,074, filed Sep. 25, 1998, now U.S. Pat. No. 6,129,808 which is a continuation-in-part of application Ser. No. 09/050,902, filed Mar. 31, 1998, now abandoned.

BACKGROUND OF THE INVENTION

1. Field of the Invention

The present invention relates generally to the fabrication of semiconductor wafers, and, more particularly, to high density plasma etching chambers having lining materials that reduce particle and metallic contamination during processing, and associated chamber lining structures.

2. Description of the Related Art

As integrated circuit devices continue to shrink in both their physical size and their operating voltages, their associated manufacturing yields become more susceptible to particle and metallic impurity contamination. Consequently, fabricating integrated circuit devices having smaller physical sizes requires that the level of particulate and metal contamination be less than previously considered to be acceptable.

In general, the manufacturing of the integrated circuit devices (in the form of wafers) includes the use of plasma etching chambers, which are capable of etching selected layers defined by a photoresist mask. The processing chambers are configured to receive processing gases (i.e., etch chemistries) while a radio frequency (RF) power is applied to one or more electrodes of the processing chamber. The pressure inside the processing chamber is also controlled for the particular process. Upon applying the desired RF power to the electrode(s), the process gases in the chamber are activated such that a plasma is created. The plasma is thus configured to perform the desired etching of the selected layers of the semiconductor wafer.

Typically, a processing chamber that is used for etching materials such as silicon oxides requires relatively high energies to achieve the desired etch result, compared to other films etched during fabrication. Such silicon oxides include, for example, thermally grown silicon dioxide ($SiO_2$), TEOS, PSG, BPSG, USG (undoped spin-on-glass), LTO, etc. The need for high energies stems from the need to bombard and break the strong bonds of the silicon oxide films and drive chemical reactions to form volatile etch products. These chambers are therefore referred to as "high density oxide etch chambers," that are capable of producing high plasma densities in order to provide a high ion flux to the wafer and achieve high etch rates at low gas pressures.

While high density oxide etch chambers work well in etching the desired wafer surfaces, the internal surfaces of the etch chamber are also subjected to the high ion power. Therefore, material from the internal surfaces of the etch chamber is removed as a result of the ion bombardment by either physical sputtering or chemical sputtering, depending on the composition of the material and the composition of the etch gas.

Recognizing that the internal surfaces of the etch chamber are exposed to the plasma in high density oxide chambers, chambers are now designed to permit the use of simple lining parts, such as, disks, rings, and cylinders. Because these parts are configured to confine the plasma over the wafer being processed, these parts are continuously exposed and attacked by the processing plasma energies. Due to this exposure, these parts ultimately erode or accumulate polymer buildup, requiring replacement or thorough cleaning. Eventually, all parts wear out to the point that they are no longer usable. These parts are hence referred to as "consumables." Therefore, if the part's lifetime is short, then the cost of the consumable is high (i.e., part cost/part lifetime).

Because these parts are consumables, it is desirable to have surfaces that are resistant to the plasma energies, which will therefore reduce the cost of the consumable. Prior art attempts to reduce the cost of the consumable have included manufacturing these parts from aluminum oxide ($Al_2O_3$) and quartz materials. Although these materials are somewhat resistant to the plasma energies, in high density oxide etch chambers, the high ion bombardment by the plasma has the down side of producing levels of contamination (e.g., particle contamination and metallic impurity contamination) that are less than acceptable. For example, if the surface of the consumable part is aluminum oxide (i.e., alumina), when the plasma bombards the surfaces, aluminum will be released and then will mix in with the plasma that lies above the wafer. Some of this aluminum becomes embedded in an organic polymer that is deposited on the wafer during etching and on the surfaces of the consumable parts (i.e., chamber liners, covers, and the like). When this happens, the polymer on the surface of the consumable parts may not be able to be completely cleaned during a conventional in-situ plasma clean or "ash" step. Thus, a friable, flaking film or powdery coating that includes C, Al, O, and F is left behind after the in-situ plasma clean, and therefore results in high particle counts. The aluminum deposited in structures being etched and the films on the silicon wafer can cause degradation of devices subsequently formed, for example, by increasing leakage current in DRAM cells.

As mentioned above, quartz is also used as the material of the interior surfaces of the consumable parts. However, quartz surfaces have been found to be an unfortunate source of particles due to the low thermal conductivity of quartz and the high etch rates in high density plasmas used to etch oxides. Additionally, low thermal conductivity quartz makes surface temperature control of these parts very difficult. This results in large temperature cycling and flaking of the etch polymer deposited on the surface of the consumable parts, and therefore causes the unfortunate generation of contaminating particles. A further disadvantage of quartz consumable parts is that the high etch rate in high density oxide etchers tends to cause pitting in the quartz, which then results in spalling of quartz particles.

In view of the foregoing, there is a need for high density plasma processing chambers having consumable parts that are more resistant to erosion and assist in minimizing contamination (e.g., particles and metallic impurities) of the wafer surfaces being processed. There is also a need for consumable parts for use in high density plasma applications, and that are capable of withstanding temperature variations while preventing damage to the consumable parts.

SUMMARY OF THE INVENTION

The present invention fills these needs by providing temperature controlled, low contamination, high etch resistant, plasma confining parts (i.e., consumables) for use in plasma processing chambers. It should be appreciated that the present invention can be implemented in numerous ways, including as a process, an apparatus, a system, a device or a method. Several inventive embodiments of the present invention are described below.

In one embodiment, disclosed is a plasma processing chamber including an electrostatic chuck for holding a wafer, and having consumable parts that are highly etch resistant, less susceptible to generating contamination and can be temperature controlled. The consumable parts include a chamber liner having a lower support section and a wall that is configured to surround the electrostatic chuck. The consumable parts also include a liner support structure having a lower extension, a flexible wall, and an upper extension. The flexible wall is configured to surround an external surface of the wall of the chamber liner, and the liner support flexible wall is spaced apart from the wall of the chamber liner. The lower extension of the liner support is however, configured to be in direct thermal contact with the lower support section of the chamber liner. Additionally, a baffle ring is part of the consumable parts, and is configured to be assembled with and in thermal contact with the chamber liner and the liner support. The baffle ring defines a plasma screen around the electrostatic chuck. A heater is then capable of being thermally connected to the upper extension of the liner support for thermally conducting a temperature from the liner support to the chamber liner and the baffle ring. Also included is an outer support that is thermally connected to a cooling ring that is coupled to a top plate of the chamber. The outer support and the cooling ring are therefore capable of providing precision temperature control to the chamber liner, along with a cast heater. This precision temperature control therefore prevents temperature drifts, which therefore advantageously enables etching a first wafer with about the same temperature conditions as a last wafer.

In a most preferred embodiment, consumable parts including the chamber liner and the baffle ring are made completely from or coated with a material selected from silicon carbide (SiC), silicon nitride ($Si_3N_4$), boron carbide ($B_4C$) and/or boron nitride (BN) material. In this manner, these materials, once exposed to the energy of the plasma sputtering, will produce volatile products that are substantially similar to volatile etch products produced during the etching of surface layers of the wafer.

In another embodiment, a plasma etching chamber having consumable parts is disclosed. The consumable parts include a chamber liner having a lower support section and a cylindrical wall that surrounds a center of the plasma etching chamber. A liner support that is configured to surround the chamber liner. The liner support is thermally connected to the lower support section of the chamber liner. The liner support further includes a plurality of slots that divide the liner support into a plurality of fingers. In a preferred embodiment, the chamber liner is made from a material selected from one of a silicon carbide (SiC) material, a silicon nitride ($Si_3N_4$) material, a boron carbide ($B_4C$) material, and a boron nitride (BN) material, and the liner support is made from an aluminum material.

In yet another embodiment, a method for using consumable parts for use in a high density plasma etching chamber is disclosed. The method includes use of a chamber liner from a material selected from one of a silicon carbide (SiC) material, a silicon nitride ($Si_3N_4$) material, a boron carbide ($B_4C$) material, and a boron nitride (BN) material. The chamber liner can have a wall that surrounds a plasma region of the chamber and a lower support section. The method can include use of an aluminum liner support optionally having a lower extension, a flexible wall and an upper extension wherein a plurality of slots are provided in the flexible wall and the lower extension of the liner support to enable the liner support to expand at elevated temperatures. The method optionally includes use of a baffle ring of silicon carbide (SiC), silicon nitride ($Si_3N_4$), boron carbide ($B_4C$) and/or boron nitride (BN). A plurality of slots can be provided in the baffle ring to define a plasma screen. The method can include thermal control of the chamber liner via a thermal path through the liner support and the baffle ring.

According to an embodiment of the invention, a plasma processing chamber includes a chamber liner and a liner support, the liner support including a flexible wall configured to surround an external surface of the chamber liner, the flexible wall being spaced apart from the wall of the chamber liner. For purposes of optional temperature control of the liner, a heater can be thermally connected to the liner support so as to thermally conduct heat from the liner support to the chamber liner. Although any suitable materials can be used for the liner and liner support, the liner support is preferably made from flexible aluminum material and the chamber liner preferably comprises a ceramic material.

The liner support can have various features. For instance, the flexible wall can include slots which divide the liner support into a plurality of fingers which enable the flexible wall to absorb thermal stresses and/or a lower extension of the liner support can be fixed to a lower support section of the chamber liner. If desired, a baffle ring in thermal contact with the chamber liner and the liner support can be used to define a plasma screen around an electrostatic chuck located in a central portion of the chamber. The chamber liner and/or baffle ring are preferably made from one or more of silicon carbide (SiC), silicon nitride ($Si_3N_4$), boron carbide ($B_4C$), and boron nitride (BN).

The plasma processing chamber can include various features. For example, the chamber liner can have low electrical resistivity and be configured to provide an RF path to ground. If desired, a gas distribution plate having high electrical resistivity can be provided over an electrostatic chuck and/or a pedestal supporting a focus ring and the electrostatic chuck. The gas distribution plate, the focus ring and/or the pedestal are preferably made from one or more of the silicon carbide (SiC), silicon nitride ($Si_3N_4$), boron carbide ($B_4C$), and boron nitride (BN). The plasma can be generated in the chamber by an RF energy source which inductively couples RF energy through the gas distribution plate and generates a high density plasma in the chamber. The RF energy source preferably comprises a planar antenna. The chamber can be used for plasma processing semiconductor wafers. For example, the chamber can be a plasma etching chamber.

The liner can have various configurations. For example, the liner support can include an outer support thermally connected to a lower extension of the liner support and the outer support can be in thermal contact with a water cooled top plate mounted on the chamber. The liner support can also include an upper extension, a flexible wall, and a lower extension, wherein the flexible wall and the lower extension have a plurality of slots that define a plurality of fingers in the liner support. For temperature control, a cast heater ring can be located in thermal contact with the liner support, the heater ring including a resistance heated element which heats the liner support so as to thermally control the temperature of the chamber liner.

According to another embodiment of the invention, a semiconductor substrate is processed in a plasma processing chamber having a chamber liner and a liner support, the liner support including a flexible wall configured to surround an external surface of the chamber liner, the flexible wall being spaced apart from the wall of the chamber liner wherein a semiconductor wafer is transferred into the chamber and an exposed surface of the substrate is processed with a high density plasma. The chamber liner is preferably a ceramic material and the liner support preferably includes an outer support extending between the liner support and a temperature controlled part of the chamber, the outer support being dimensioned to minimize temperature drift of the chamber liner during sequential processing of a batch of semiconductor wafers. During wafer processing, the ceramic liner is preferably removed from the chamber and replaced with another ceramic liner after processing a predetermined number of semiconductor wafers. Further, the chamber liner can include a wafer entry port enabling passage of the wafer into the chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

Figure 1:
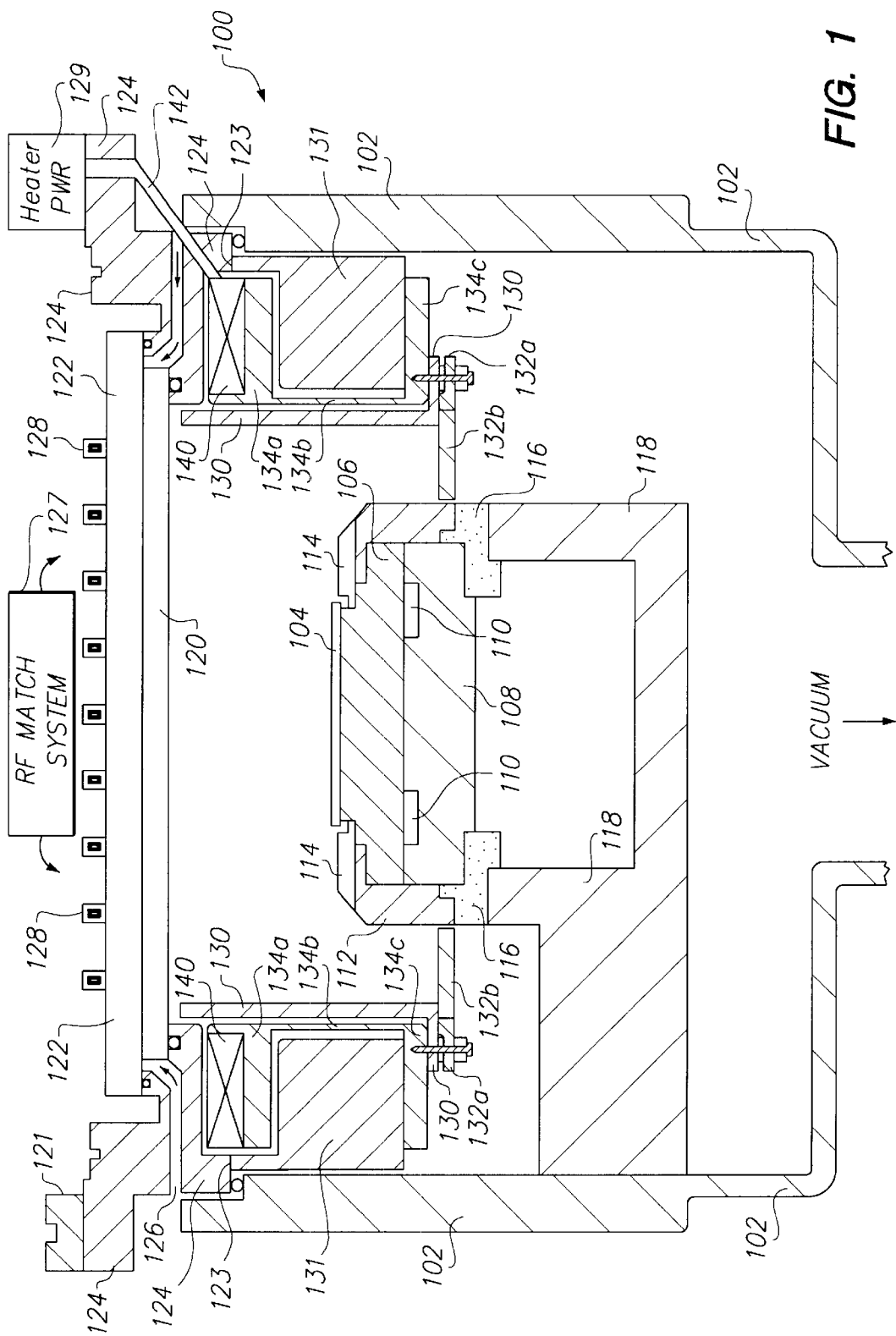
FIG. 1 shows a high density plasma etching chamber in accordance with one embodiment of the present invention.

The invention provides one or more temperature controlled, low contamination, high etch resistant, plasma confining parts (i.e., consumables) for use in plasma processing chambers. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

The plasma confining parts of the present invention are preferably in the form of, for example, chamber liners, baffle rings, gas distribution plates, focus rings, liner supports, and other non-electrically driven parts. These parts are preferably configured to be substantially non-contaminating and etch resistant, and they are preferably temperature controlled without damaging the parts. The plasma confining parts are preferably made from materials that consist of elements that are innocuous to devices being fabricated on the wafer, such as silicon (Si), carbon (C), nitrogen (N), or oxygen (O). In this manner, when the plasma confining parts are bombarded by ions (i.e., sputtered by the plasma), volatile products that combine with the process gases are produced. These volatile products can then be removed from the chamber using a vacuum pump and will not end up on the wafer causing contamination. In a preferred embodiment wherein the plasma confining parts are in a plasma etch chamber, such parts can be more resistant to the etch gases and the life of the parts can be prolonged.

The plasma confining parts of the present invention are preferably made from one or more materials such as, for example, silicon carbide (SiC), silicon nitride ($Si_3N_4$), boron carbide ($B_4C$), and boron nitride (BN). These materials all have the desirable characteristics of having high etch resistance, non-contaminating elements, and volatile etch products. In a most preferred embodiment, the plasma confining parts (also referred to as consumable parts) are made from solid silicon carbide (SiC), which therefore reduces metal and/or particle contamination of the processed wafer. The SiC used for the baffle ring 132 and liner 130 is preferably electrically conductive so that when it is in contact with the plasma it presents a good ground path for the RF current. Higher resistivity SiC can be used for a gas distribution plate ("GDP") (i.e., 120 of FIG. 1) in order to permit inductive coupling of RF power through it. As mentioned above, the SiC also etches at a slow rate by the plasma making it a cost-effective consumable part.

Moreover, because the SiC is of high purity, wafer contamination resulting from chemical sputtering of the SiC by the plasma can be minimized. Further, the grounded SiC can reduce sputtering of other surfaces in the chamber by causing a reduction in the plasma potential and hence ion bombardment energy to any non-silicon carbide surfaces. The SiC component also provides a very stable plasma potential so that etch results are more repeatable within an individual chamber and from chamber to chamber. For more information on the use of plasma confining parts capable of reducing contamination high density plasma processing, reference may be made to a commonly assigned U.S. patent application having application Ser. No. 09/050,902, filed on Mar. 31, 1998, and entitled "Contamination Controlling Method and Apparatus For A Plasma Processing Chamber." This application is hereby incorporated by reference. The various embodiments of the present invention will now be described with reference to FIGS. 1 through 8.

FIG. 1 shows a high density plasma etching chamber 100 in accordance with one embodiment of the present invention. A chamber housing 102 is shown containing a semiconductor substrate such as a silicon wafer 104, that may be subjected to a plasma etching operation. In this embodiment, the etching operating is preferably a high density plasma operation that is configured to etch materials such as silicon oxides, that may be formed on the surface of the wafer 104. The high density (e.g., plasmas having a densities between about $10^{11}$–$10^{12}$ ions/cm$^3$) plasma is established in the chamber by ensuring that the chamber is held at a relatively low pressure of below about 80 mTorr, and most preferably between about 1 mTorr and about 40 mTorr. The pressure in the chamber is generally maintained by implementing a suitable vacuum pump at the bottom of the chamber.

The wafer 104 is shown supported over an electrostatic chuck 106. Beneath the electrostatic chuck 106 is a lower electrode 108 which contains a backside cooling ring 110 for controlling the temperature of the electrostatic chuck 106. The electrostatic chuck 106 is confined by a pedestal 112 and a focus ring 114 that surrounds the wafer 104. In one embodiment of the present invention, the pedestal 112 and the focus ring 114 are preferably made from a material selected from a group including: (a) silicon carbide (SiC), (b) silicon nitride ($Si_3N_4$), (c) boron carbide ($B_4C$), or (d) boron nitride (BN). In a most preferred embodiment, $Si_3N_4$ is selected as the material for the pedestal 112 and the focus ring 114.

According to one embodiment, an insulating alumina ring 116 sits between an aluminum pedestal 118 and the lower electrode 108 and the silicon carbide pedestal 112. A chamber liner 130 is preferably a cylindrical liner which can be attached to a baffle ring 132. The baffle ring 132 generally includes an inner ring 132a that makes good electrical contact as well as good thermal contact with the chamber liner 130. The baffle ring 132 also has an integral array of teeth 132b which will be described in greater detail with reference to FIGS. 2A through 2C.

Above the wafer 104 is a gas distribution plate (GDP) 120 which functions as a showerhead to release the etch gas chemicals into the processing chamber. Above the gas distribution plate 120 sits a ceramic window 122. Above the ceramic window 122 is an RF coil system 120 (i.e., an RF antenna), which is used to supply a top RF power into the reactor chamber 100. The RF coils 120 are preferably cooled via a cooling channel that is integrated at the center of the RF coils 120. In this simplified illustration, a gas feed port 126 is used to feed processing gases into channels that are defined between the ceramic window 122 and the gas distribution plate 120. For more information on process chambers, reference may be made to a TCP 9100™ plasma etching reactor, which is available from Lam Research Corporation, of Fremont, Calif.

An RF impedance matching system 127 is configured to mount over the processing chamber and make suitable contact with the RF coils 122 in order to control the delivery of power as well as other reactor controlling parameters. As mentioned above, the ceramic window 122 is designed to be in contact with the gas distribution plate that mounts within a top plate 124. The top plate 124 defines an interface between atmospheric pressure and a desired vacuum condition within the high density plasma etching chamber 100. As should be apparent to those skilled in the art, the desired pressure interface is established by placing a suitable number of O-rings between interfaces of the chamber housing 102, the top plate 124, the GDP 120, the ceramic window 122, and the RF match system 127.

A liner support 134 is also provided within the high density plasma etching chamber 100 to enable precision control and transfer of a desired temperature to the chamber liner 130 and the baffle ring 132. In this embodiment, the liner support 134(is made of aluminum to facilitate its flexibility and improve its thermal conductivity. The liner support 134 includes an upper extension 134a, a flexible wall 134b, a lower extension 134c, and a liner support extension 134d. The lower extension 134c is shown assembled in direct thermal contact with the chamber liner 130, and the baffle ring 132. In this embodiment, the flexible wall 134b is slightly separated from the chamber liner 130. A heater 140 is capable of being secured in direct thermal contact with the upper extension 134a of the liner support 134. To power up and control the heater 140, a power connection 142 is used to couple to a heater power system 129. The liner support is therefore well suited to control a desired temperature that can be thermally transferred to the chamber liner 130 and the baffle ring 132 without causing damage to the (more brittle) chamber liner 130 or baffle ring 132.

Also shown is an outer support 131, which is thermally connected to the lower extension 134c of the liner support 134. The outer support is also thermally coupled to the top plate 124, which is designed to receive a cooling ring 121. As will be described in greater detail below with reference to FIGS. 5A and 5B, the outer support 131 is used to achieve precision temperature control of the chamber liner 130 during wafer processing operations (e.g., etching). The precision temperature control provided by the outer support 131 and cooling ring 121 will therefore advantageously assist in preventing the chamber liner temperature from gradually drifting upwards (due to the plasma energies) faster than the liner's ability to radiate the heat to its surroundings.

As mentioned above, the chamber liner 130 and the baffle ring 132 are preferably made of a pure silicon carbide material. In addition, the gas distribution plate 120, the focus ring 114 and the pedestal 112 are also made of a pure silicon nitride or carbide materials, or at least silicon carbide coated. In this manner, substantially all of the surfaces that confine the high density plasma will be pure silicon carbide, or coated silicon carbide. In a broad context, other materials that consist only of elements that are innocuous to devices on the wafer being processed, such as silicon (Si), carbon (C), nitrogen (N), or oxygen, which form volatile etch products with the etch gases, may be used. In this manner, the volatile products produced when the internal surfaces that confine the plasma are bombarded, will mix with the excess etch gases that are commonly removed from the chamber (using a vacuum pump or the like). Because the products produced when the plasma bombards the internal surfaces of the chamber (i.e., the consumable parts) are volatile, these products will not end up on the surface of the wafer causing contamination, nor end up embedded in the polymer deposited on the consumable parts.

Figure 2A:
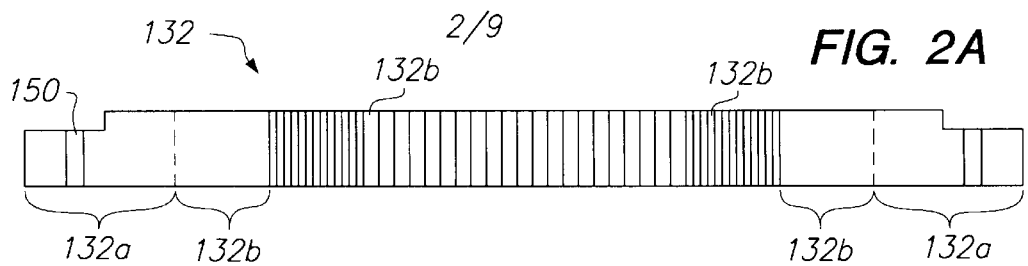
FIGS. 2A through 2C illustrate in more detail a baffle ring in accordance with one embodiment of the present invention.
Figure 2B:
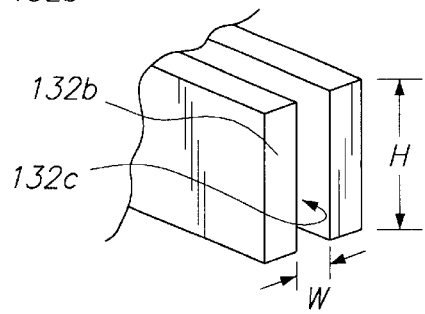
Figure 2C:
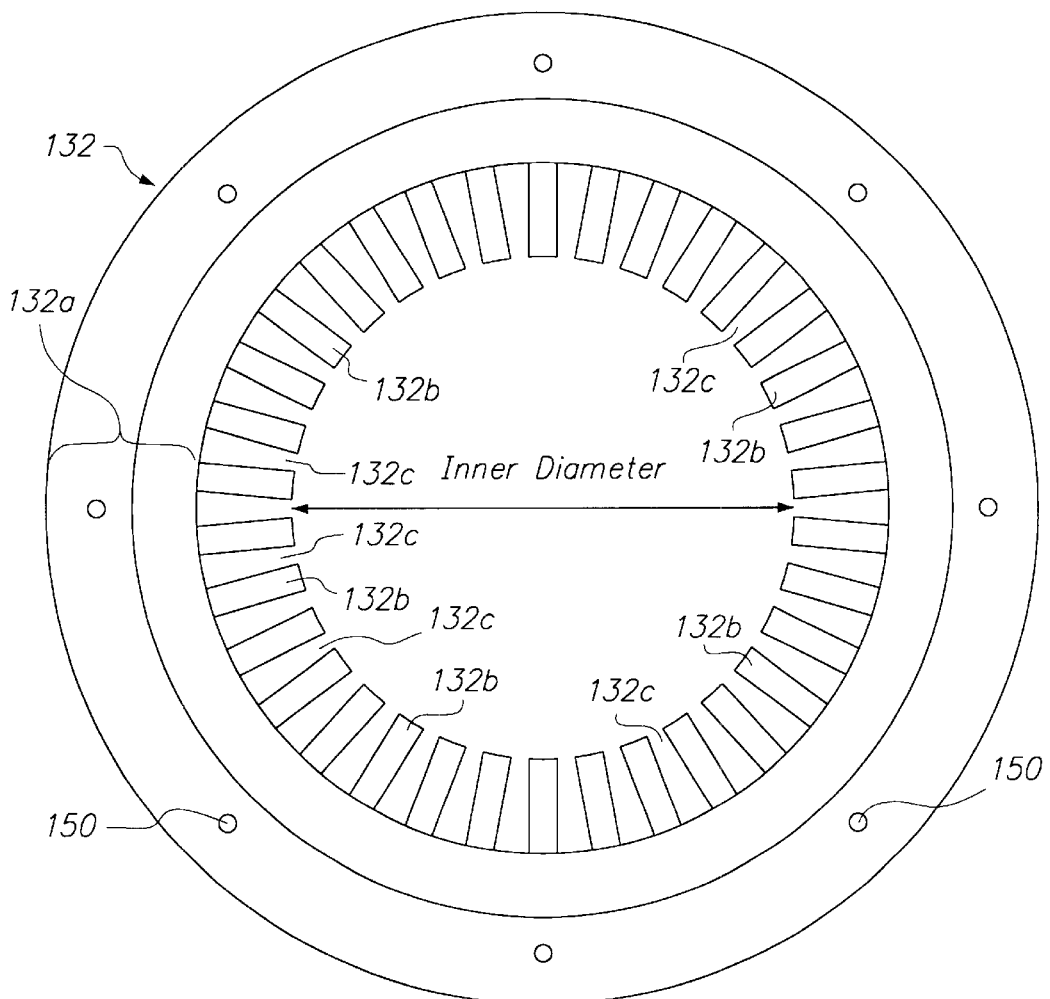

FIGS. 2A through 2C illustrate in more detail the baffle ring 132 in accordance with one embodiment of the present invention. As shown in FIG. 1, the baffle ring 132 functions as a plasma screen for the passage of gases and by-products to a vacuum pump connected at the bottom of the chamber 102. As shown, the baffle ring 132 has an array of teeth 132b that assist in maintaining the plasma in the top half of the chamber 102, where the silicon carbide surfaces (of the consumables) confine the plasma substantially over the wafer 104. The baffle ring 132 also has an inner ring 132a which is used to make good thermal contact with the chamber liner 130.

FIG. 2B is a three-dimensional view of a pair of teeth 132b. Generally, the open areas provided by the spaces 132c are configured such that a percentage ranging between 50 and 70 percent open area is maintained to allow a sufficient passageway for the gases and by-products to be pumped out of the chamber 102. To make each of the spaces 132c, as shown in FIG. 2C, the solid silicon carbide material (or coated SiC material) must be machined such that a suitable aspect ratio that is at least 1.5 or greater, is maintained. In this exemplary configuration, the width of the spaces 132c are preferably set to about 0.13 inch, and the height is set to about 0.28 inch. These preferred dimensions therefore provide an aspect ratio of about 2.0.

The inner diameter (ID) of the baffle ring 132, in this 200 mm wafer chamber embodiment, is set to about 10.75 inches, such that about 1/16 inch clearance is provided between the pedestal 112 shown in FIG. 1. However, the inner diameter (ID) may of course be larger, depending upon the size of the wafer being processed. For example, for a 300 mm wafer, the inner diameter may be as large as about 14 inches.

In alternative embodiments, the baffle ring 132 may be manufactured such that the teeth 132b are replaced with an array of holes or slots. When an array of holes or slots are manufactured in place of the teeth 132b, it is still desired to maintain an open area (i.e., pathway), that amounts to between about 50 percent and 70 percent. The baffle ring 132 is also shown having a plurality of screw holes 150 which are designed around the outer ring 132a. As shown in FIG. 1, the screw holes 150 will be configured to receive a suitable screw that will help interconnect the baffle ring 132 to the chamber liner 130 and the liner support 134. Other fasteners such as clamps could be envisioned that would supply the necessary contact force to permit sufficient heat transfer.

Figure 3A:
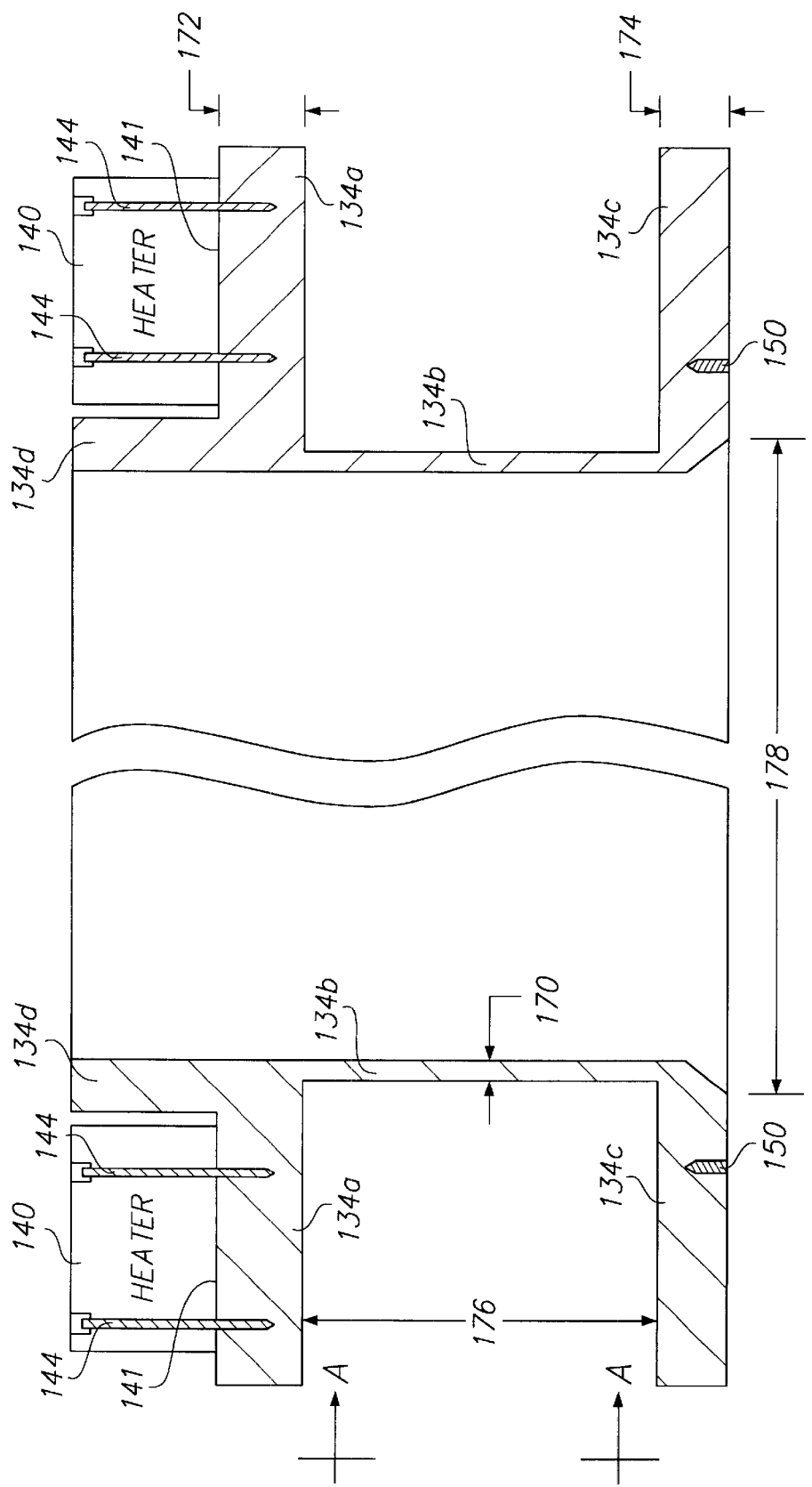
FIG. 3A shows a more detailed cross-sectional diagram of a liner support in accordance with one embodiment of the present invention.

FIG. 3A shows a more detailed cross-sectional diagram of the liner support 134 in accordance with one embodiment of the present invention. As mentioned above, the liner support 134 has a flexible wall 134b which is configured to flex in response to heat deformation that may occur when the heater 140 applies the desired heat level. Preferably, the flexible wall 134b is cylindrical and is slotted into a plurality of fingers. As mentioned above, the liner support is preferably made of an aluminum material which will have good thermal conductivity and will also provide good flexibility when a desired temperature is applied by the heater 140. Because the lower extension 134c is bolted to the chamber liner 130 and the baffle ring 132, the lower extension 134c will remain in place while the upper extension 134a, which is coupled to the heater 140 at a heat-conductive interface 141, may be able to flex outwardly as illustrated in FIG. 3C.

The heater 140 is preferably secured to the upper extension 134a using a suitable number of screws 144 to ensure that the heat conductive interface 141 is maintained all the way around the upper extension 134a. In a preferred embodiment, the screws 144 will be capable of maintaining the heater 140 in contact with the upper extension 134a with a pressure of about 1,000 pounds per square inch.

When the high-density plasma etching chamber 100 is configured to process an 8-inch wafer (i.e., 200 mm wafer), the liner support 134 may have an inner diameter of about 14½ inches. The thickness 170 of the flexible wall 134b may range between about 1/16 inch and about 3/32 inch. The 1/16 inch dimension is preferably used for processing temperatures ranging up to about 300° C., while the 3/32 dimension is reserved for chambers having processing temperatures up to about 1000° C.

The separation 176 between the lower extension 134c and the upper extension 134a is preferably set to about 2½ inches, depending upon the chamber height. However, the greater the separation 176 is, the greater the thermal resistance in the liner support 134. Therefore, the separation 176 is kept just short enough such that the aluminum material of the liner support will not become too stressed as temperatures reach 300° C. and above. The exemplary thickness 172 for the upper extension 134a is preferably set to about 9/16 inch, while the exemplary thickness of the lower extension 134c is set to about 5/8 inch.

Figure 3B:
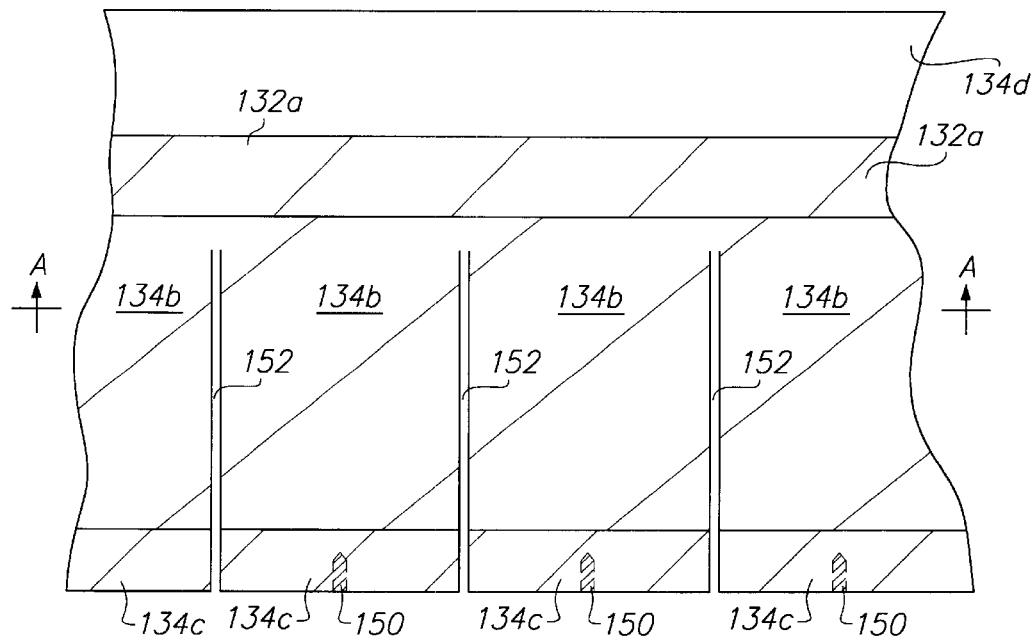
FIG. 3B shows a side view of the liner support from cross section A—A of FIG. 3A, in accordance with one embodiment of the present invention.
Figure 3C:
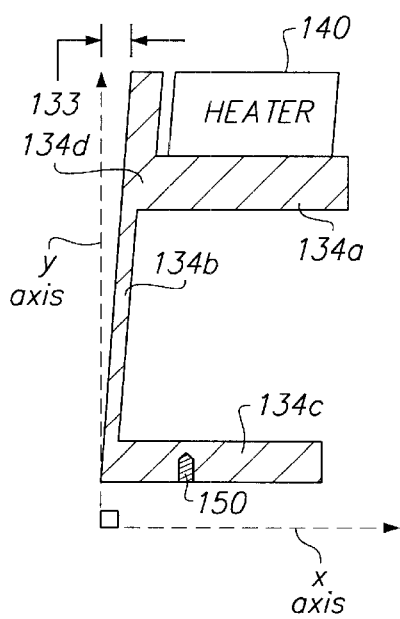
FIG. 3C illustrates the flexibility of the liner support when subjected to temperature stresses in accordance with one embodiment of the present invention.

FIG. 3B shows a side view of the liner support 134 from cross section A—A of FIG. 3A, in accordance with one embodiment of the present invention. To facilitate the flexibility of the liner support 134, slots 152 are defined into the sides of the liner support 134 defining a plurality of fingers. The slots 152 vertically extend through the flexible wall 134b and through the lower extension 134c. Because the liner support 134 is preferably a cylindrically shaped unit, the separation between the slots 152 must be configured such that a suitable level of flexibility remains in the flexible wall 134b. Therefore, the separation between slots 152 is preferably set to about 15 degrees. However, the actual separation between the slots 152 may vary and also change depending upon the diameter of the liner support 134 and the degree of flexibility that is desired. Also shown, are the screw holes 150 which are defined in the lower extensions 134c.

To illustrate the flexibility provided by the liner support 134, FIG. 3C shows the liner support extending outwardly from a Y axis (relative to a horizontal X-axis) to achieve a separation 133. In certain cases, the separation may be as much as 1/16 inch, or more. Accordingly, the liner support 134 will advantageously be able to withstand the thermal stress placed on the aluminum material of the liner support 134, while insulating the less flexible chamber liner 130 and the baffle ring 132 from temperature deforming stresses.

Figure 4:
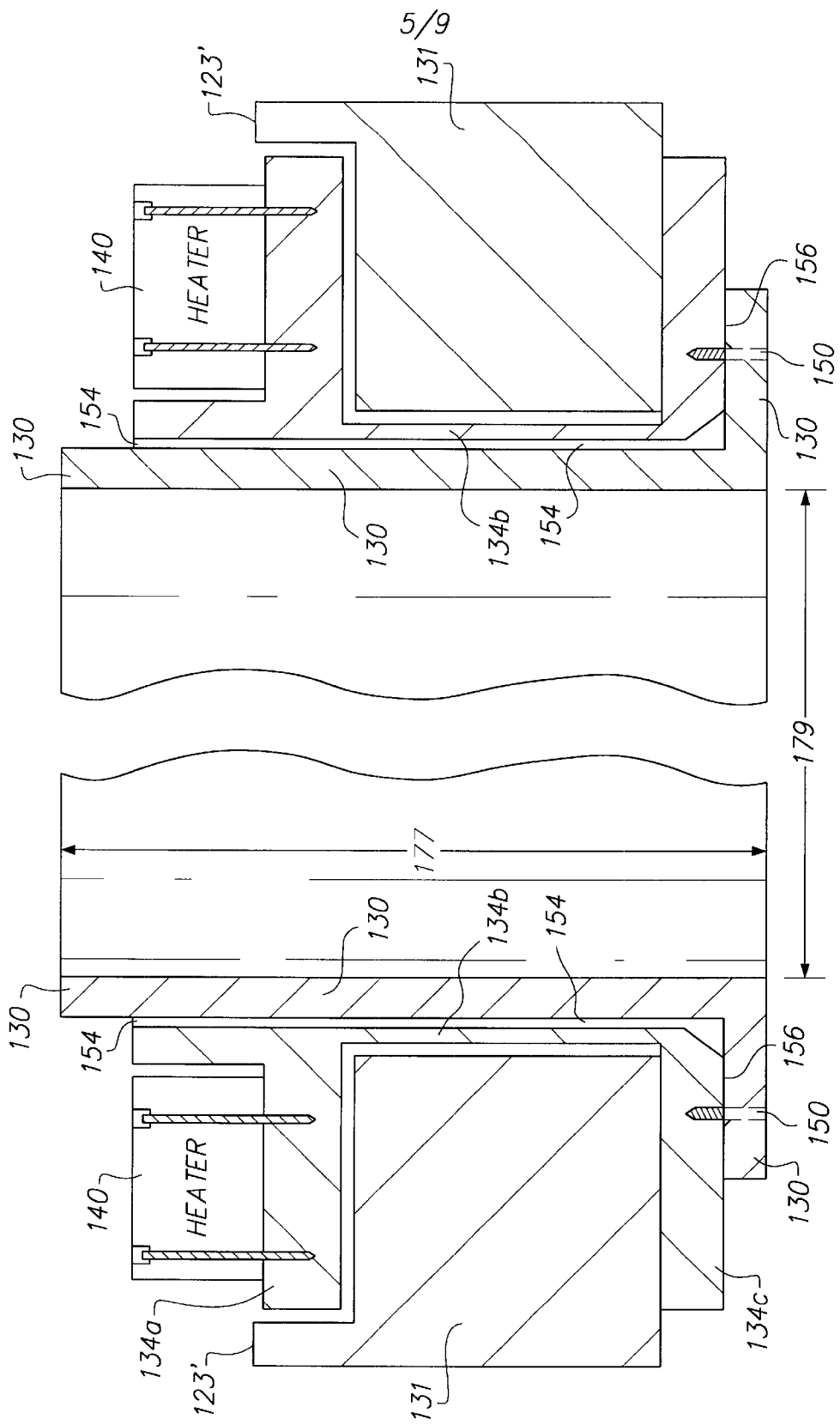
FIG. 4 illustrates how the chamber liner is assembled with the liner support in accordance with one embodiment of the present invention.

FIG. 4 illustrates how the chamber liner 130 is assembled with the liner support 134 in accordance with one embodiment of the present invention. In this embodiment, when the chamber liner 130 is made of silicon carbide, it will provide a high integrity RF return path to ground for the powered electrode 108 (bottom electrode). As is well known to those skilled in the art, providing a high integrity RF ground path in the processing chamber brings the advantage of having excellent process repeatability. Further, the grounded SiC can reduce sputtering of other surfaces in the chamber by causing a reduction in the plasma potential and hence ion bombardment energy on any non-silicon carbide surfaces.

Additionally, the materials used for the chamber liner 130, such as SiC, can have their electrical resistivity modified over a wide range. For example, the resistivity of SiC can be tailored for the specific application. When used for the chamber liner 130 and the baffle plate 132, the SiC is modified to provide a low resistivity that will facilitate the good conductive path to ground for the RF power. On the other hand, high resistivity is needed when the part must have RF power inductively coupled through it, in order to minimize power dissipation in the part. Thus, high resistivity SiC is preferably used for the gas distribution plate (GDP) 120.

As shown, the screw holes 150 are configured to go through the chamber liner 130 at a lower support section and then go into the liner support 134. Generally, a suitable number of screws are used to interconnect the chamber liner 130 and the liner support 134 such that a good thermally conductive interface 156 is maintained. In this manner, the heat conducted through the liner support 134 may be thermally communicated to the chamber liner 130 and the baffle ring 132.

In this preferred embodiment, the liner support 134 is preferably spaced apart from the chamber liner 130 by a space 154. The space 154 is preferably set to about 1/16 inch. This separation is generally desired because the liner support 134 is configured to flex as described with reference to FIG. 3C. For a 200 mm wafer chamber, a diameter 179 of the chamber liner 130 is about 14 inches. The thickness of the chamber liner 130 is preferably set, in this embodiment, to be between about 0.1 inch and about 0.3 inch, and most preferably, to about 0.2 inch. The height 177 of this exemplary chamber liner may be between about 3 inches and about 12 inches, and most preferably about 5 inches.

Also shown is the outer support 131, which is thermally connected to the lower extension 134c of the liner support 134. Preferably, the outer support is spaced apart from the flexible wall 134b so that it can flex without substantial obstruction. The outer side of the outer support 131 has an upper extending wall having a surface 123', which is configured to make good thermal contact with the top plate 124. In this manner, a cooling ring 121, shown in more detail in FIG. 5A, can be used to control the temperature of the chamber liner 130 and the internal regions of the chamber. Accordingly, through the combined simultaneous control of both the heater 140 and cooling ring 121, the temperature of the chamber liner 130 can be maintained to within less than ±10 degrees C. from a no plasma condition through a sustained plasma on condition. Thus, the first wafer etched can be etched with the same chamber liner 130 temperature as the last wafer etched, to within the ±10 degrees C. variation.

Figure 5A:
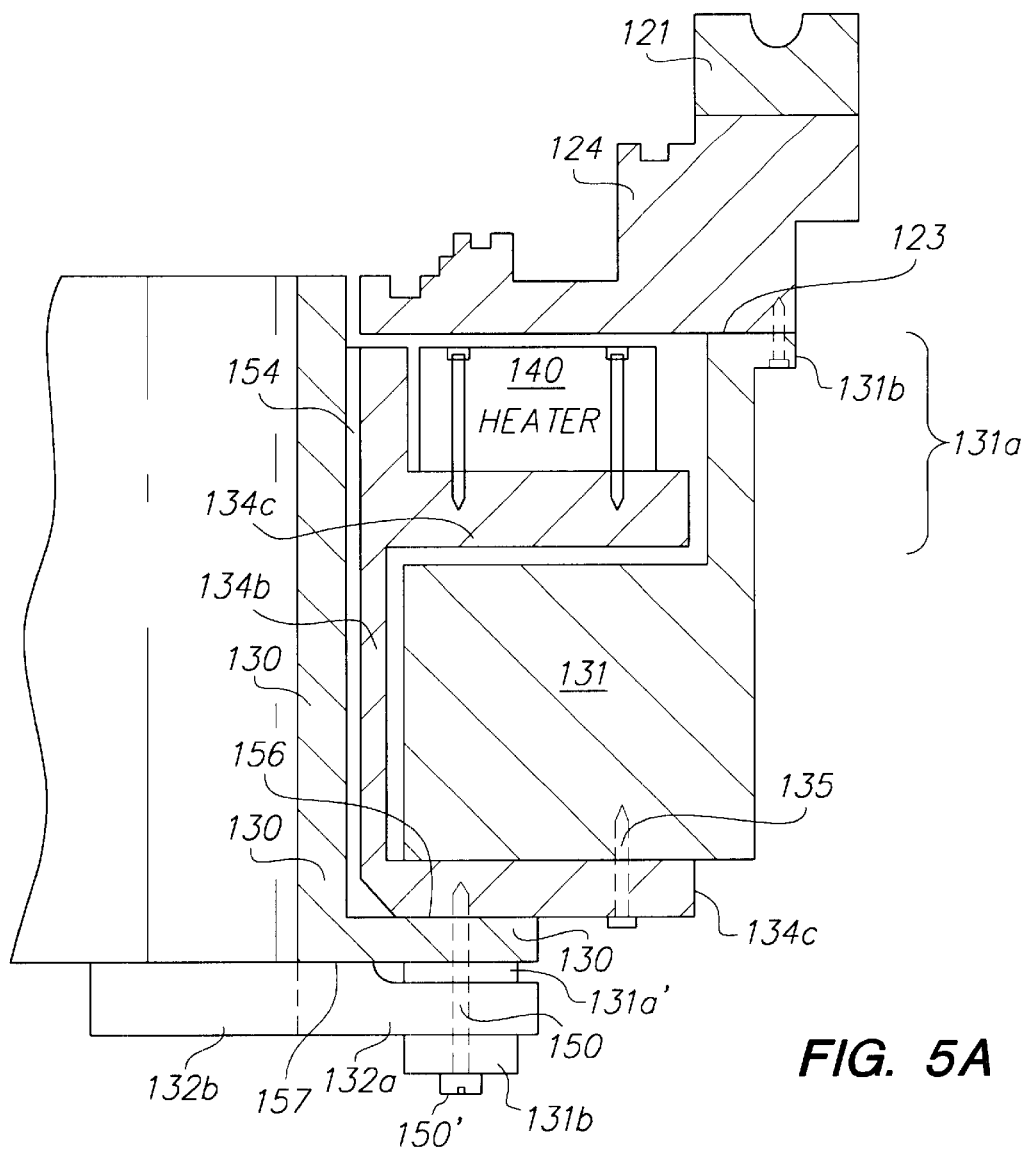
FIG. 5A shows a partial cross-sectional view of the chamber liner, the liner support, and the baffle ring, assembled in accordance with one embodiment of the present invention.
Figure 5B:
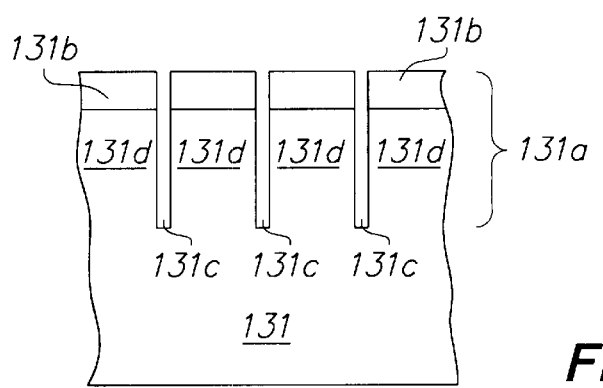
FIG. 5B shows a side view of an outer support in accordance with one embodiment of the present invention.

FIG. 5A shows a partial cross-sectional view of the chamber liner 130, the liner support 134, and the baffle ring 132 assembled in accordance with one embodiment of the present invention. As shown, the chamber liner 130 and the liner support 134 are assembled to achieve a good thermal conductive interface 156 as described above.

As mentioned above, the outer support 131 is thermally connected to the lower extension 134c through a plurality of screws 135. The outer support 131, in a most preferred embodiment, has a flexible wall 131a, which is shown to be thermally connected to the top plate 124. A side view of the outer support 131 is also provided in FIG. 5B, to illustrate how a plurality of fingers 131d, separated by a plurality of slots 131c, assist in providing the necessary flexibility to the flexible wall 131a. The top plate 124 is further configured to receive the cooling ring 121 on a top lip of the top plate 124. Of course, other configurations for applying the cooling ring 121, or other type of cooling system, to the top plate 124 may be used.

In this embodiment, the combined use of the heater 140 and the cooling ring 121 will enable precision temperature control in narrow temperature ranges. For example, the chamber liner 130 is typically run at high temperatures, such as 200 degrees C. or more, while heat is lost to the surroundings primarily through radiation. When plasma is initiated, the plasma dumps more heat into the chamber liner 130 by ion bombardment. The chamber liner 130 will slowly increase in temperature over time because it generally cannot transfer this heat to its surroundings by radiation as fast as it gains heat from the plasma. Thus, the outer support 131, which is thermally coupled to the cooling ring 121, is well suited to eliminate the chamber liner's temperature drift. In this embodiment, the heat loss to the outer support 131 from the liner support 134 can be set by adjusting the cross-section and length of the outer support 131. This adjustment, can therefore be made to control the heat loss path from the liner support 134 to the temperature controlled top plate 124.

As shown, the chamber liner 130 will also provide a good thermal conductive interface 157 with the baffle ring 132. To achieve this good conductive interface, the baffle ring 132, the chamber liner 130, and the liner support 134 are secured together using a plurality of screws 150'. Preferably, the screws 150' are fitted through a spacer ring 131b which is in direct contact with the inner ring 132a of the baffle ring 132, a spacer 131a', and the chamber liner 130.

The spacer ring 131b and the spacer 131a' are preferably made of aluminum and provide a good surface for applying pressure to the screws 150' and the brittle surfaces of the baffle ring 132 and the chamber liner 130. That is, because the baffle ring 132 is preferably a ceramic, applying too greater of a force with screws directly to the baffle ring may cause a crack in the baffle ring or the chamber liner 130. Once the screws 150' are secured all the way around the chamber, the chamber liner, the baffle ring and the liner support (i.e., the consumable parts) will be ready for use in the high density plasma etching chamber 100 of FIG. 1. As used herein, these parts are referred to as consumable parts, however, when silicon carbide (or other alternative materials described herein) is used for the parts that confine the high density plasma, these parts will have a longer lifetime, and therefore, a lower cost of consumables.

When replacement is needed, these parts may be swiftly replaced with replacement parts (i.e., using a quick clean kit). Because the liner support 134 is not designed to be in contact with the high density plasma, it may not wear out as fast as the chamber liner 130 and the baffle ring 132. Thus, the liner support 134 may be removed from worn out consumable parts (that may be cleaned off-line and re-used or discarded), and then used with the replacement consumable parts. When the chamber is being used in fabrication where chamber down time translates into lower yields, the ability to quickly replace these consumables will have the benefit of reducing the mean time to clean the chamber.

Figure 6:
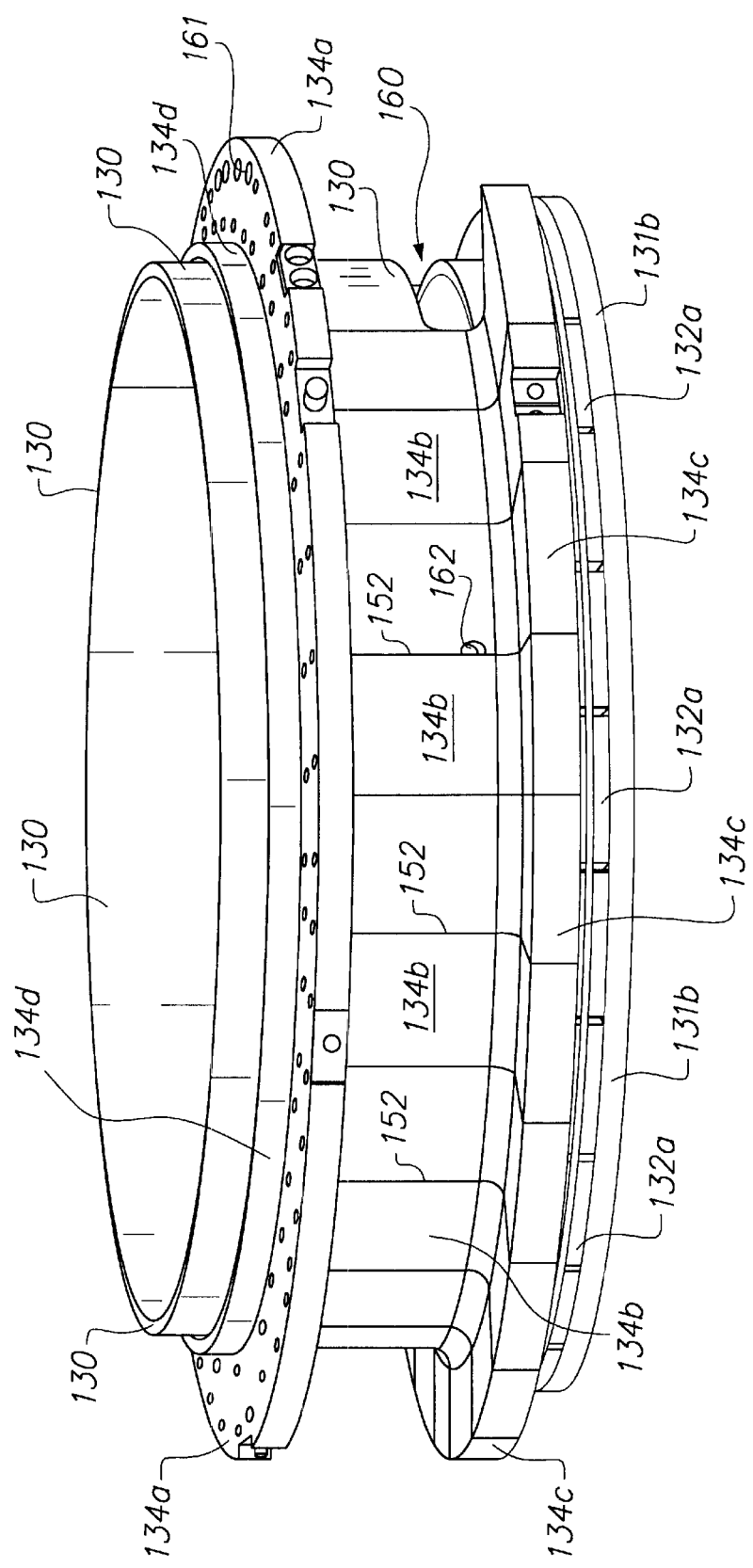
FIG. 6 illustrates a three-dimensional assembled view of the chamber liner, the baffle ring, and the liner support, in accordance with one embodiment of the present invention.
Figure 7:
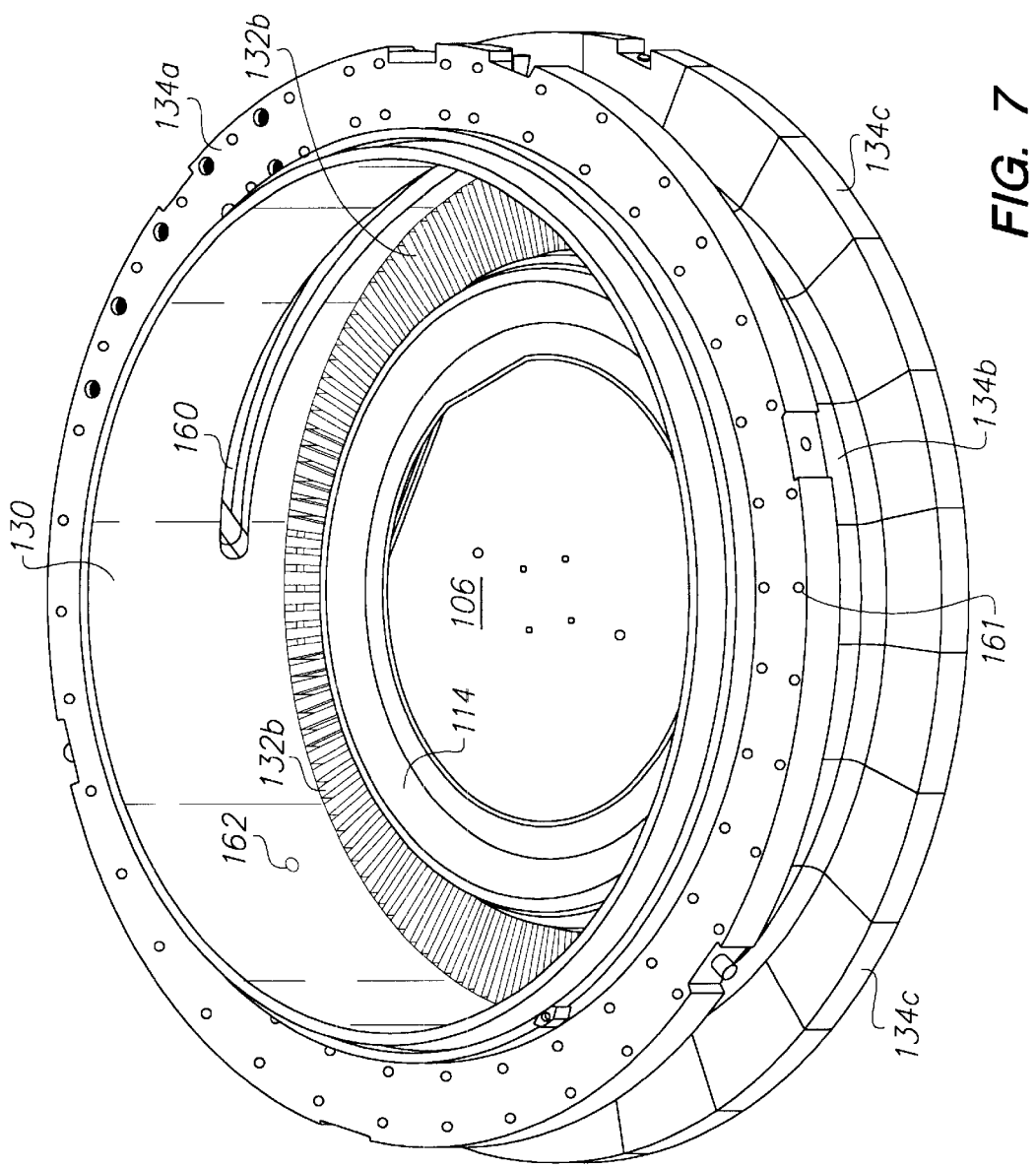
FIG. 7 shows another three-dimensional view of the assembled chamber liner, liner support, and the baffle ring, in accordance with one embodiment of the present invention.

FIG. 6 illustrates a three-dimensional assembled view of the chamber liner 130, the baffle ring 132, and the liner support 134, in accordance with one embodiment of the present invention. As shown, the top surface of the upper extension 134a of the liner support 134, is configured with a plurality of screw holes that will receive the heater 140. Along the walls of the liner support 134 are the plurality of slots 152 that define fingers configured to flex in response to temperature variations. A wafer entry port 160 is defined in the wall of the chamber liner 130 to enable the passage of a wafer into and out of the chamber 100. Typically, the wafer is preferably passed into the chamber using a robot arm which must partially fit into the port 160, and release the wafer once over the electrostatic chuck 106. Therefore, the port 160 should be large enough to receive the wafer and robot arm, but also maintained small enough to not disrupt the plasma profile over the wafer. As shown in FIG. 7, an insert with a slot in the shape of the port 160 is attached to the outside of the liner Like the other consumable parts, the insert can be of SiC, $Si_3N_4$, $B_4C$ and/or BN.

The liner support 134 typically also includes through holes 162 which are also defined in the chamber liner 130. The through holes 162 may include holes for probing the pressure within the chamber during processing, and for optically detecting the endpoint in a particular process. Also shown with greater detail are plurality of holes 161 which are used to receive the screws 144 for holding down the heater 140 to the upper extension 134a of the liner support 134.

FIG. 7 shows another three-dimensional view of the assembled chamber liner 130, liner support 134, and the baffle ring 132. From this view, the port hole 160 used for passing a wafer to the electrostatic chuck 106, is shown in greater detail. Also shown are the teeth 132b of the baffle ring 132. The teeth 132b therefore extend in close proximity to the pedestal 112 to screen the plasma from the lower part of the chamber as shown in FIG. 1.

Figure 8:
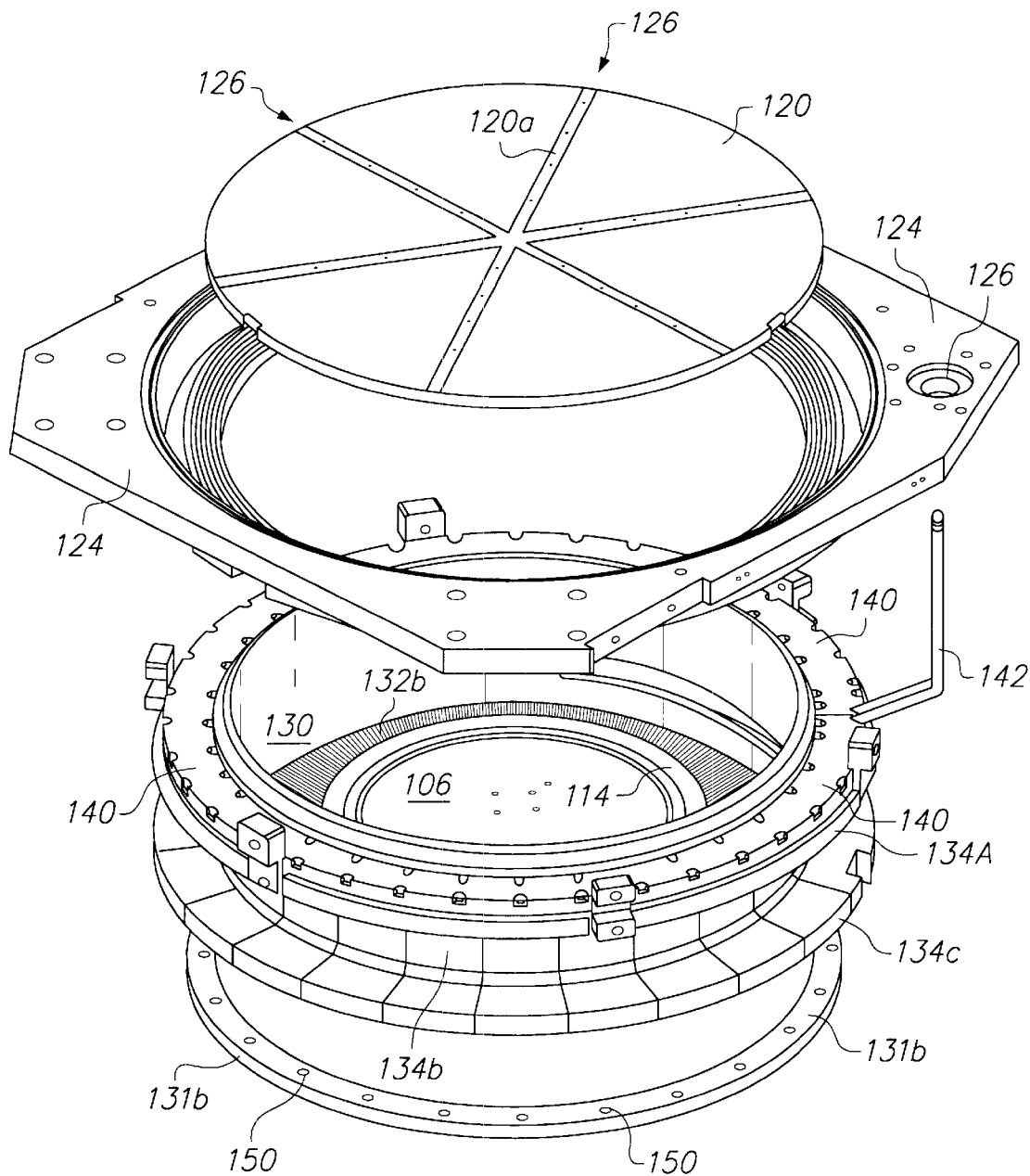
FIG. 8 shows an exploded view of portions of the high-density plasma etching chamber of FIG. 1 in accordance with one embodiment of the present invention.

FIG. 8 shows an exploded view of portions of the high-density plasma etching chamber 100 of FIG. 1 in accordance with one embodiment of the present invention. This view shows the spacer ring 131b that is used in the assembly of the baffle ring 132, the chamber liner 130, and the liner support 134. This perspective also illustrates how the heater 140 is applied over the top extension 134a of the liner support 134. The heater 140, as shown, is preferably a cast heater. Of course, other types of heating systems may also work. When the heater 104 is appropriately secured, a good thermal contact will be made with the liner support 134.

The power connection 142 is also shown, which will be passed through a hole 124a in the top plate 124. The top plate 124 is shown capable of receiving the gas distribution plate 120. The gas distribution plate 120 has channels 120a which enable processing gases fed by gas feed ports 126 to be directed into the chamber 100. Although not shown in this example, the ceramic window 122 may then be lowered over the gas distribution plate 120.

In a preferred embodiment of the present invention, the high density plasma etch chamber 100 is particularly well suited to etch silicon oxide materials, such as, for example, thermally grown silicon dioxide ($SiO_2$), TEOS, PSG, BPSG, USG (undoped spin-on-glass), LTO, etc., while reducing the introduction of unwanted contaminants. For exemplary purposes only, to achieve the high density plasma conditions in the chamber 100, the pressure within the chamber is preferably maintained below about 80 mTorr, and the RF coil 128 (i.e., top electrode) is preferably set to between about 2500 watts and about 400 watts, and most preferably to about 1,500 watts. The bottom electrode 108 is preferably maintained between about 2500 watts and about 700 watts, and most preferably at about 1,000 watts. In typical high density oxide etch processes, process gases such as, $CHF_3$, $C_2HF_5$ and/or $C_2F_6$ are introduced into the chamber to generate the desired etching characteristics.

As mentioned previously, the materials that can be used for the plasma confining parts (e.g., the consumables, including the chamber liner 130, the baffle ring 132, the GDP 120, the focus ring 114, and the pedestal 112) are generally innocuous to layers being fabricated on the wafer 104. That is, volatile etch products that result from etching the surfaces of the wafer 104 will be similar to the volatile products produced when the consumables are bombarded (i.e., sputtered) with the plasma energies. As an advantageous result, these volatile products produced from ion bombardment of the consumables will join the normal volatile etch products.

This therefore facilitates the removal of these combined volatile products from the internal region of the chamber 100 through the use of a vacuum pump that connects to the chamber. Due to the fact that the volatile products from the consumables are able to be expeditiously removed from the wafer processing region, substantially fewer levels of particulates and metallic contaminants will interfere with the devices being fabricated on the surface of the wafer 104. While this invention has been described in terms of several preferred embodiments, it will be appreciated that those skilled in the art upon reading the preceding specifications and studying the drawings will realize various alterations, additions, permutations and equivalents thereof. Therefore, although specific details are provided with respect to reducing contamination for semiconductor wafers, such benefits may also apply to flat panel display substrates, and the like. Furthermore, although a preferred material for the consumable parts is pure silicon carbide (SiC), the material may also be a SiC coated material such as SiC coated graphite, or principally SiC with 10 to 20% Si added to fill porosity in reaction bonded SiC. As also mentioned previously, the consumable parts may also be made from materials such as, silicon nitride ($Si_3N_4$), boron carbide ($B_4C$), and boron nitride (BN). These materials all have the desirable characteristics of having high etch resistance, non-contaminating elements, and volatile etch products.

It is therefore intended that the present invention include all such alterations, additions, permutations, and equivalents as fall within the true spirit and scope of the invention.

What is claimed is:

1. A plasma processing chamber having a chamber liner and a liner support within an interior of the plasma processing chamber, the liner support including a flexible wall configured to surround an external surface of the chamber liner, the flexible wall being spaced apart from the external surface of the chamber liner.

2. A plasma processing chamber as recited in claim 1, further comprising a heater thermally connected to the liner support so as to thermally conduct heat from the liner support to the chamber liner.

3. A plasma processing chamber as recited in claim 1, wherein the liner support is made from flexible aluminum material and the chamber liner comprises a ceramic material.

4. A plasma processing chamber as recited in claim 3, wherein the flexible wall includes slots which divide the liner support into a plurality of fingers which enable the flexible wall to absorb thermal stresses.

5. A plasma processing chamber as recited in claim 4, wherein a lower extension of the liner support is fixed to a lower support section of the chamber liner.

6. A plasma processing chamber as recited in claim 1, further comprising a baffle ring in thermal contact with the chamber liner and the liner support, the baffle ring defining a plasma screen around an electrostatic chuck located in a central portion of the chamber.

7. A plasma processing chamber as recited in claim 6, wherein the baffle ring is made from one or more of silicon carbide (SiC), silicon nitride ($Si_3N_4$), boron carbide ($B_4C$), and boron nitride (BN).

8. A plasma processing chamber as recited in claim 1, wherein the chamber liner is made from one or more of silicon carbide (SiC), silicon nitride ($Si_3N_4$), boron carbide ($B_4C$), and boron nitride (BN).

9. A plasma processing chamber as recited in claim 1, wherein the chamber liner has low electrical resistivity and is configured to provide an RF path to ground.

10. A plasma processing chamber as recited in claim 1, further comprising a gas distribution plate defined over an electrostatic chuck, the gas distribution plate having high electrical resistivity.

11. A plasma processing chamber as recited in claim 10, wherein the gas distribution plate is made from one or more of silicon carbide (SiC), silicon nitride ($Si_3N_4$), boron carbide ($B_4C$), and boron nitride (BN).

12. A plasma processing chamber as recited in claim 1, further comprising a focus ring and a pedestal supporting the focus ring and an electrostatic chuck.

13. A plasma processing chamber as recited in claim 12, wherein the focus ring and the pedestal are made from one or more of silicon carbide (SiC), silicon nitride (Si$_3$N$_4$), boron carbide (B$_4$C), and boron nitride (BN).

14. A plasma processing chamber as recited in claim 1, further comprising a focus ring, a pedestal, and/or a gas distribution plate made from one or more of silicon carbide (SiC), silicon nitride (Si$_3$N$_4$), boron carbide (B$_4$C), and boron nitride (BN).

15. A plasma processing chamber as recited in claim 11, further comprising an RF energy source which inductively couples RF energy through the gas distribution plate and generates a high density plasma in the chamber.

16. A plasma processing chamber as recited in claim 15, wherein the RF energy source comprises a planar antenna.

17. A plasma processing chamber as recited in claim 1, wherein the liner support further includes an outer support thermally connected to a lower extension of the liner support, the outer support being in thermal contact with a water cooled top plate mounted on the chamber.

18. A plasma processing chamber as recited in claim 1, wherein the chamber is a plasma etching chamber.

19. A plasma processing chamber as recited in claim 1, wherein the liner support includes an upper extension, a flexible wall, and a lower extension, wherein the flexible wall and the lower extension have a plurality of slots that define a plurality of fingers in the liner support.

20. A plasma processing chamber as recited in claim 1, wherein a cast heater ring is in thermal contact with the liner support, the heater ring including a resistance heated element which heats the liner support so as to thermally control the temperature of the chamber liner.

21. A plasma processing chamber as recited in claim 1, wherein the chamber liner includes a wafer entry port enabling passage of the wafer into the chamber.

22. A plasma processing chamber as recited in claim 1, wherein the liner support is removably attached to a portion of the chamber.

23. A plasma processing chamber as recited in claim 6, wherein the baffle ring includes openings therein through which gases and by-products are removed from the chamber.

24. A plasma processing chamber as recited in claim 4, wherein the lower extension is bolted to the chamber liner.

25. A plasma processing chamber as recited in claim 1, wherein the flexible wall is separated from an inner periphery of the chamber wall and flexes due to heat deformation towards and away from the chamber wall.

26. A plasma processing chamber as recited in claim 1, wherein the chamber liner is a cylindrical one-piece ceramic liner.

27. A plasma processing chamber as recited in claim 1, wherein the flexible wall includes inner and outer surfaces, the flexible wall being divided into a plurality of fingers by slots extending from the inner surface to the outer surface.

28. A plasma processing chamber having a heater, a ceramic chamber liner and a liner support, the liner support being within an interior of the plasma processing chamber and including a flexible metal wall configured to surround an external surface of the chamber liner, the flexible metal wall being spaced apart from the chamber liner and the flexible metal wall having a thickness which is less than a thickness of the chamber liner, the flexible metal wall including slots which divide the liner support into a plurality of fingers which enable the flexible metal wall to absorb thermal stresses, and the heater being thermally connected to the liner support so as to thermally conduct heat from the liner support to the chamber liner.

29. A plasma processing chamber having a heater, a chamber liner, a baffle ring, a focus ring, a gas distribution plate and a liner support, the liner support being within an interior of the plasma processing chamber and including a flexible metal wall configured to surround an external surface of the chamber liner, the flexible wall including slots which divide the liner support into a plurality of fingers which enable the flexible wall to absorb thermal stresses, the heater being thermally connected to the liner support so as to thermally conduct heat from the liner support to the chamber liner, the baffle ring being in thermal contact with the chamber liner and the liner support, the baffle ring defining a plasma screen around an electrostatic chuck located in a central portion of the chamber, the gas distribution plate having high electrical resistivity, and the focus ring being located on a pedestal supporting the electrostatic chuck, the chamber liner, the baffle ring, the focus ring and the gas distribution plate being made from silicon carbide.

30. A plasma processing chamber having a ceramic chamber liner, a ceramic window, an antenna, a gas distribution plate and a liner support, the liner support being within an interior of the plasma processing chamber and including a flexible metal wall configured to surround an external surface of the chamber liner, the flexible metal wall including slots which divide the liner support into a plurality of fingers which enable the flexible metal wall to absorb thermal stresses, the gas distribution plate comprising a showerhead through which process gas is supplied to the interior of the plasma processing chamber, the ceramic window being located between the gas distribution plate and the antenna, the antenna comprising an RF energy source which inductively couples RF energy through the ceramic window and the gas distribution plate so as to generate a high density plasma in the interior of the plasma processing chamber, the ceramic chamber liner and the gas distribution plate being made from one or more of silicon carbide (SiC), silicon nitride (Si$_3$N$_4$), boron carbide (B$_4$C), and boron nitride (BN).

* * * * *